US007565948B2

(12) United States Patent
Parker et al.

(10) Patent No.: US 7,565,948 B2
(45) Date of Patent: Jul. 28, 2009

(54) ACOUSTIC WAVEGUIDING

(75) Inventors: Robert Preston Parker, Westborough, MA (US); Dewey Potter, Holliston, MA (US); Hal P. Greenberger, Milford, MA (US)

(73) Assignee: Bose Corporation, Framingham, MA (US)

( * ) Notice: Subject to any disclaimer, the term of this patent is extended or adjusted under 35 U.S.C. 154(b) by 132 days.

(21) Appl. No.: 10/805,440

(22) Filed: Mar. 19, 2004

(65) Prior Publication Data

US 2005/0205348 A1 Sep. 22, 2005

(51) Int. Cl.
*H05K 5/00* (2006.01)

(52) U.S. Cl. ....................... 181/148; 181/155; 181/196; 181/199

(58) Field of Classification Search ................. 181/148, 181/155, 196, 199; 381/148, 155, 196, 199, 381/336, 89, 335, 337, 338, 341, 342, 349, 381/351, 352
See application file for complete search history.

(56) References Cited

U.S. PATENT DOCUMENTS

| | | | | | |
|---|---|---|---|---|---|
| 1,952,514 | A | * | 3/1934 | Selby | 181/18 |
| 2,812,032 | A | | 11/1957 | Kock | 181/5 |
| 2,912,061 | A | | 11/1959 | Kock | 181/31 |
| 3,122,215 | A | | 2/1964 | Sutton | |
| 3,234,559 | A | * | 2/1966 | Bartholoma et al. | 343/779 |
| 3,977,006 | A | * | 8/1976 | Miersch | 343/778 |
| 4,020,284 | A | | 4/1977 | Phillips | |
| 4,224,469 | A | | 9/1980 | Karson | |
| 4,628,528 | A | | 12/1986 | Bose et al. | |
| 4,733,749 | A | | 3/1988 | Newman et al. | |
| 4,887,690 | A | | 12/1989 | Patel | |
| 4,903,300 | A | | 2/1990 | Polk | |
| 4,924,962 | A | | 5/1990 | Terai et al. | |
| 4,930,596 | A | * | 6/1990 | Saiki et al. | 181/152 |
| 4,942,939 | A | | 7/1990 | Harrison | |
| 4,944,362 | A | * | 7/1990 | Motsinger et al. | 181/213 |
| 5,012,890 | A | | 5/1991 | Nagi et al. | 181/160 |
| 5,170,435 | A | | 12/1992 | Rosen et al. | |

(Continued)

FOREIGN PATENT DOCUMENTS

DE 2509369 10/1976

(Continued)

OTHER PUBLICATIONS

E.V. Carlson "Soothing the Hearing Aid Frequency Response", *Journal of the Audio Engineering Society*, vol. 22, No. 6, pp. 426-429 (1974).

(Continued)

*Primary Examiner*—Jeffrey Donels
*Assistant Examiner*—Forrest M Phillips
(74) *Attorney, Agent, or Firm*—Fish & Richardson P.C.

(57) ABSTRACT

An acoustic waveguide system contains a trunk waveguide and a number of branch waveguides. The trunk waveguide section defines an interior passage and includes at least one open end. A number of branch waveguide sections define an interior passage and include a junction end and a terminal end, with the junction end coupled to the trunk waveguide. One or more cavities can be coupled to at least one of the trunk or branch sections and communicate therewith through a vent for damping the resonance peak of a target standing wave.

53 Claims, 15 Drawing Sheets

U.S. PATENT DOCUMENTS

| | | | | |
|---|---|---|---|---|
| 5,193,118 | A | 3/1993 | Latham-Brown et al. | |
| 5,197,103 | A | 3/1993 | Hayakawa | |
| 5,369,796 | A | 11/1994 | Kung | |
| 5,479,520 | A * | 12/1995 | Nieuwendijk et al. | 381/353 |
| 5,637,840 | A | 6/1997 | Kim | |
| 5,659,155 | A | 8/1997 | Porzilli | |
| 5,721,401 | A | 2/1998 | Sim | |
| 5,796,854 | A | 8/1998 | Markow | |
| 5,821,471 | A * | 10/1998 | McCuller | 181/156 |
| 5,889,875 | A * | 3/1999 | Caron et al. | 381/338 |
| 5,920,633 | A | 7/1999 | Yang | |
| 6,141,428 | A * | 10/2000 | Narus | 381/338 |
| 6,278,789 | B1 | 8/2001 | Potter | |
| 6,363,157 | B1 | 3/2002 | Chick | |
| 6,411,720 | B1 | 6/2002 | Pritchard | |
| 6,634,455 | B1 * | 10/2003 | Yang | 181/156 |
| 6,648,098 | B2 * | 11/2003 | Nichols | 181/193 |
| 6,668,969 | B2 | 12/2003 | Meyer et al. | |
| 2002/0085731 | A1 * | 7/2002 | Aylward | 381/349 |
| 2002/0150270 | A1 | 10/2002 | Werner | |
| 2004/0005069 | A1 | 1/2004 | Buck | 381/336 |
| 2004/0105559 | A1 | 6/2004 | Aylward et al. | |
| 2005/0089184 | A1 | 4/2005 | Wang | |
| 2005/0135642 | A1 | 6/2005 | Dry | |
| 2005/0195987 | A1 | 9/2005 | Kim | |

FOREIGN PATENT DOCUMENTS

| | | |
|---|---|---|
| EP | 0453230 | 10/1991 |
| EP | 0624045 | 11/1994 |
| EP | 1221823 | 7/2002 |
| EP | 1 571 873 | 7/2005 |
| EP | 1577880 | 9/2005 |
| EP | 1585108 | 10/2005 |
| GB | 2391739 | 8/2002 |
| JP | S57-22477 | 5/1982 |
| JP | S61-20490 | 1/1986 |
| JP | 04150195 A * | 5/1992 |
| JP | 2005-269633 | 9/2005 |
| JP | 2005-269634 | 9/2005 |
| WO | WO 91/19406 | 12/1991 |

OTHER PUBLICATIONS

Official office action issued Mar. 28, 2007, U.S. Appl. No. 10/914,497, entitled Acoustic Radiating, filed Aug. 9, 2004.

Office Action dated Dec. 5, 2008 in corresponding Chinese application No. 200510054270.1.

Response to Examination Report from European Application No. 04300106.4-1224 dated Feb. 10, 2009.

* cited by examiner

ACOUSTIC WAVEGUIDING

BACKGROUND

This description relates to acoustic waveguiding.

Acoustic waveguiding has been used in products such as the commercially available Bose® WAVE® radio, WAVE® Radio/CD and ACOUSTIC WAVE® (Bose Corporation, Framingham, Mass.) music systems.

SUMMARY

In general, in one aspect, the invention features an acoustic waveguide system including a trunk acoustic waveguide section having a free end and branch acoustic waveguide sections each having a junction end coupled to the trunk and a terminal end to receive an acoustic energy source.

Implementations of the inventions according to this aspect may include one or more of the following features. The cross-sectional area of at least one of the branch sections decreases from the terminal end to the junction end. In one example, the internal volumes of two of the branch waveguides are substantially the same. The waveguide system can also include an acoustic energy source having an acoustic driver. The driver can include a first radiating surface acoustically coupled to the terminal end of the branch section and a second radiating surface facing free air. In one example, the second radiating surfaces can be oriented toward a listening area.

The waveguide system can include a main housing in which the branch waveguide sections include subsections that are partially formed by panels extending from inside surfaces of the main housing. The main housing can be substantially a parallelepiped. In one example, the cross-sectional area of the trunk waveguide section increases along the length from the free end. The lengths of the subsections can be substantially the same. At least two of the branch waveguide sections can be coupled at different locations along the trunk section. The branch waveguide sections can be spatially separated from each other and can have unequal lengths.

In general, in another aspect, the invention features an acoustic waveguide system including a trunk waveguide section having a single free end, first and second branch waveguide sections coupled to the trunk waveguide section at locations other than the open end. Each of the first and second waveguide sections has a terminal end acoustically coupled to an acoustic energy source including at least one acoustic driver.

Implementations of the invention may include one or more of the following features. The first and second branch waveguide sections can have substantially the same length and substantially the same cross-sectional area along their lengths. The first and second waveguide sections can be spatially separated from each other. The cross-sectional area of the branch waveguide sections can progressively increases along the length from the junction end coupled to the trunk.

The acoustic driver can include a first radiating surface facing the free air and a second radiating surface, opposite the first surface, acoustically coupled to the trunk waveguide section. The first radiating surface can be oriented toward a listening area. In one example, the first and second waveguide sections are acoustically decoupled from each other by an electronic device. The electronic device can provide program information to the first and second waveguide sections using the acoustic energy sources.

In general, in another aspect, the invention features an audio player including a housing, an electronic audio circuit, an acoustic energy source coupled to the electronic audio circuit, and a waveguide structure. The waveguide structure includes a trunk acoustic waveguide section having a free end, and branch acoustic waveguide sections having a junction end coupled to the trunk and a terminal end to receive an acoustic energy source.

In general, in another aspect, the invention features an electroacoustical waveguide transducing system including a trunk acoustic waveguide section having a free end, first and second branch acoustic waveguide sections each having a junction end coupled to the trunk and a terminal end to receive an acoustic energy source. First and second acoustic energy sources are coupled to the terminal ends of the first and second branch waveguide sections and include first and second acoustic drivers each with a first radiating surface acoustically coupled to the terminal ends of the first and second sections and a second radiating surface facing the free air.

The waveguide system can be configured such that the relationship between the cross-sectional area, A of the free end and the wavelength of sound at a low frequency cutoff of the waveguide, λ is given by:

$$(\sqrt{A})/\lambda \leqq 0.067.$$

In one example low frequency cutoff is about 55 Hz and the cross-sectional area is about 2.5 square inches.

In general, in another aspect, the invention features a tree-structure acoustic waveguide system including a first number of open end root nodes and a second number of terminal end leaf nodes. The first number of open end root nodes are connected to the second number of terminal end leaf nodes with one or more waveguide sections and a third number of internal nodes. Each one of the second number of terminal leaf nodes are acoustically coupled to an acoustic energy source.

Implementations of this aspect of the invention may include one or more of the following features. The second number of terminal end leaf nodes is larger than the first number of open end root nodes. The first number of open end root nodes are spatially separated from each other. Each of the second number of terminal end leaf nodes can be coupled to an acoustic energy source. The acoustic energy source can include at least one acoustic driver. The second number of terminal end leaf nodes can be spatially separated from each other. In one example, different program information is fed into the second number of terminal end leaf nodes.

In general, in another aspect, the invention features a trunk acoustic waveguide section having a free end, first and second branch acoustic waveguide sections each having a junction end coupled to the trunk and a terminal end to receive an acoustic energy source, and an elongate cavity defining a volume substantially smaller than the volume of the trunk and branch sections. The cavity is connected with either the branch sections or trunk section at a vent which forms an aperture between the sections and the cavity. The elongate cavity is sized and the vent is positioned along at least one of the branch and trunk sections to substantially damp a resonance peak.

Implementations of this aspect of the invention may include one or more of the following features. The elongate cavity can be a bifurcated resonance chamber. The elongate cavity can be filled partially or substantially with a dampening material.

In general, in another aspect, the invention features an electroacoustical waveguide transducing system including a waveguide having a free end and closed end and an elongate cavity defining a volume substantially smaller than the volume of the waveguide. The cavity communicates with the waveguide at a vent located at a point along the length of the waveguide corresponding to the pressure maximum of a target standing wave within the waveguide.

Implementations of this aspect of the invention may include one or more of the following features. The system can further include first and second branch acoustic waveguide sections each having a junction end coupled to the closed end and a terminal end to receive an acoustic energy source. The system can also include first and second acoustic drivers each having a first radiating surface acoustically coupled to the terminal ends of the first and second sections and a second radiating surface facing free air.

The system can also include acoustic dampening material positioned proximate the vent or within the elongate cavity. The relationship between the cross-sectional area of the free end, A and the wavelength of sound at a low frequency cutoff of the waveguide, λ can be characterized by the following:

$$(\sqrt{A})/\lambda \leqq 0.067.$$

Other advantages and features will become apparent from the following description and from the claims.

DESCRIPTION

Figure 5:
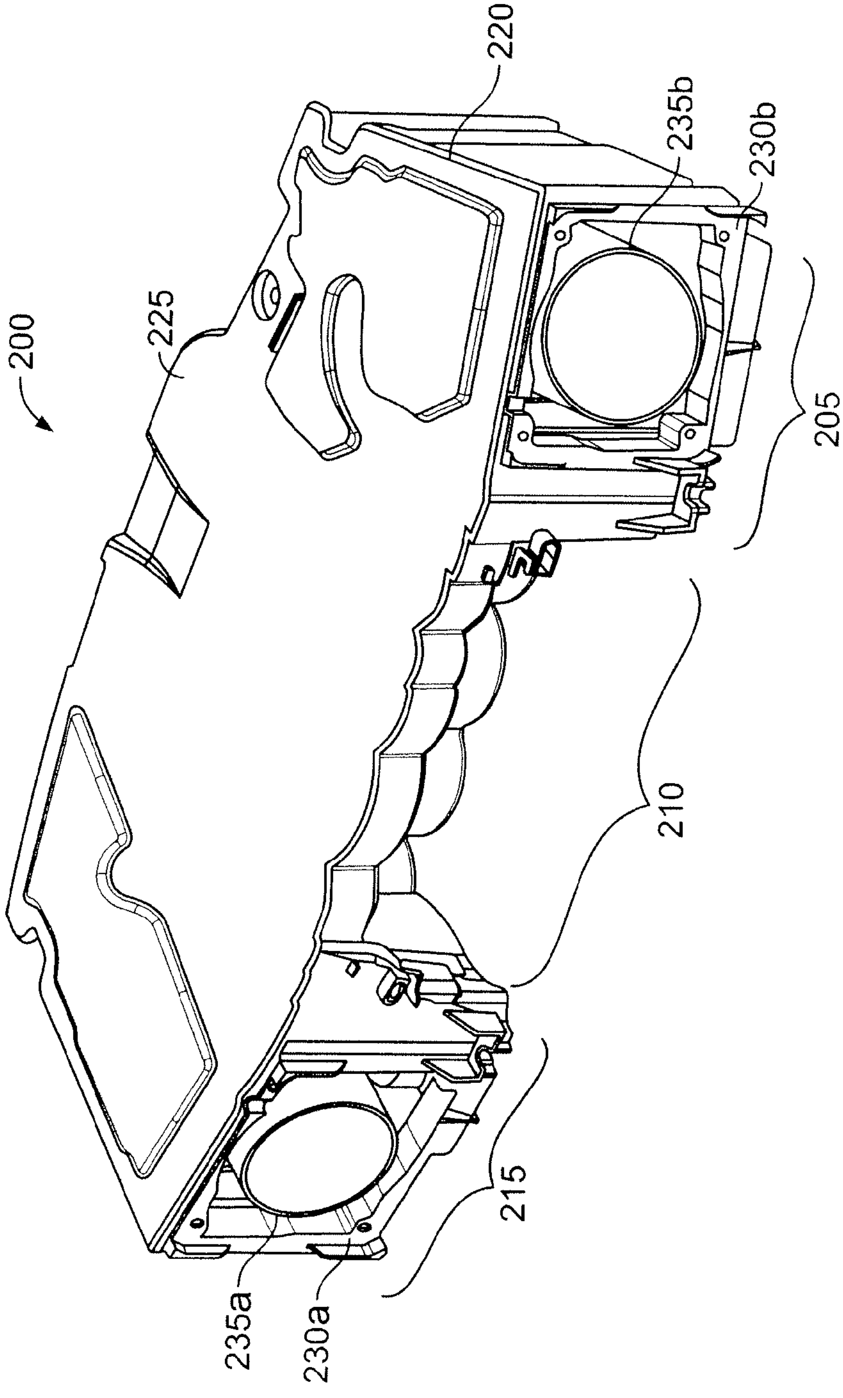
FIG. 5 is a perspective view of an exemplary waveguide system.
Figure 7A:
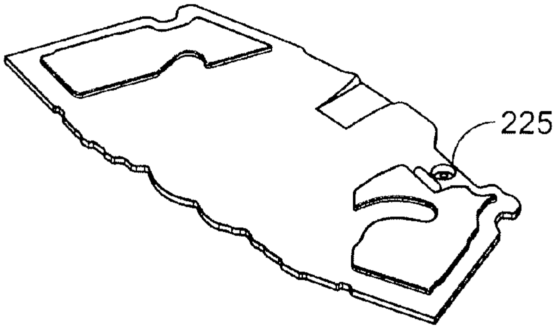
Figure 7B:
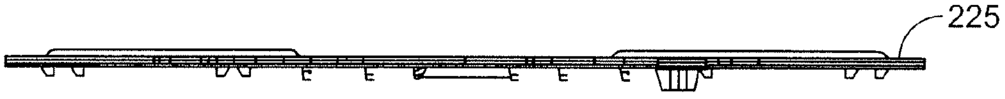
Figure 7C:
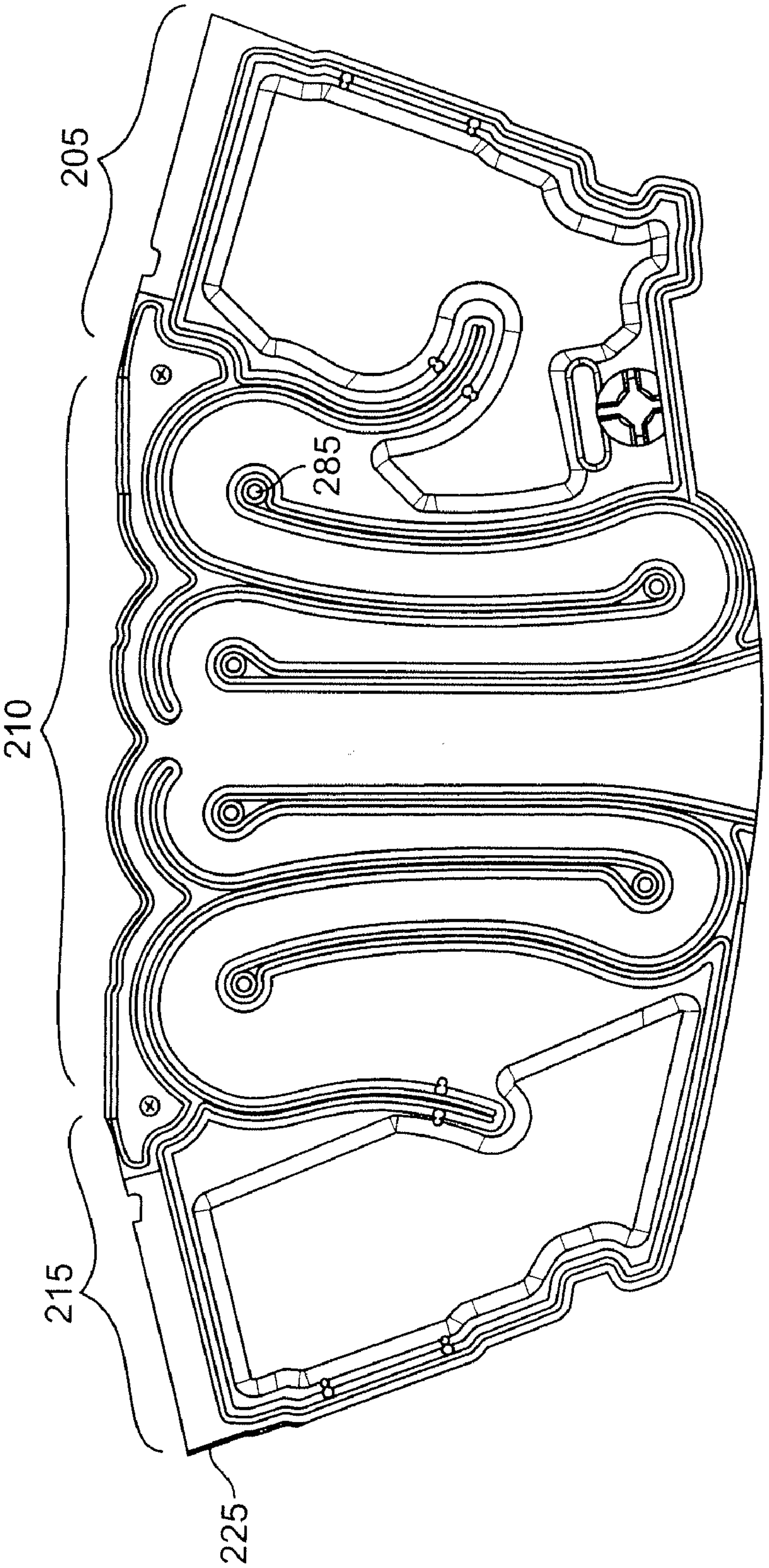

FIGS. 7A, 7B, and 7C are three-dimensional, side and bottom views, respectively, of a cover section to the apparatus of FIG. 5.

Figure 8A:
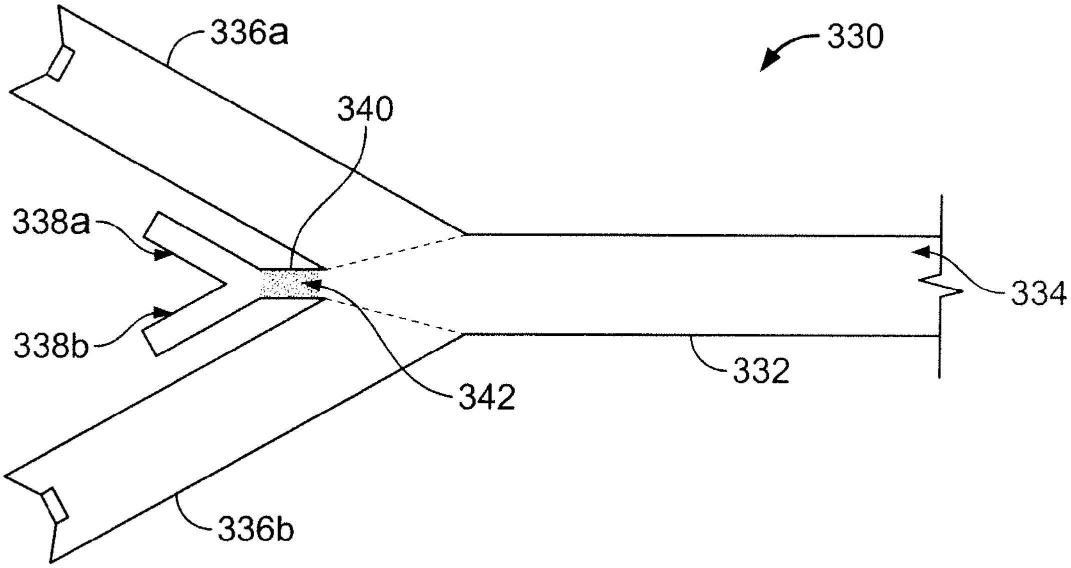
Figure 8B:
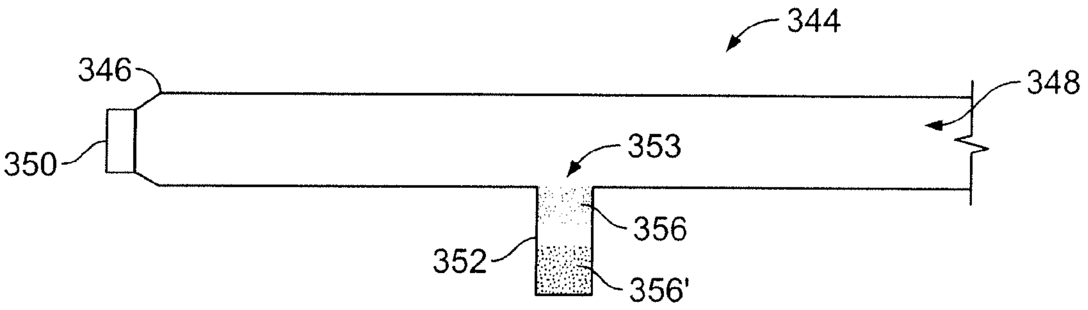
Figure 8C:
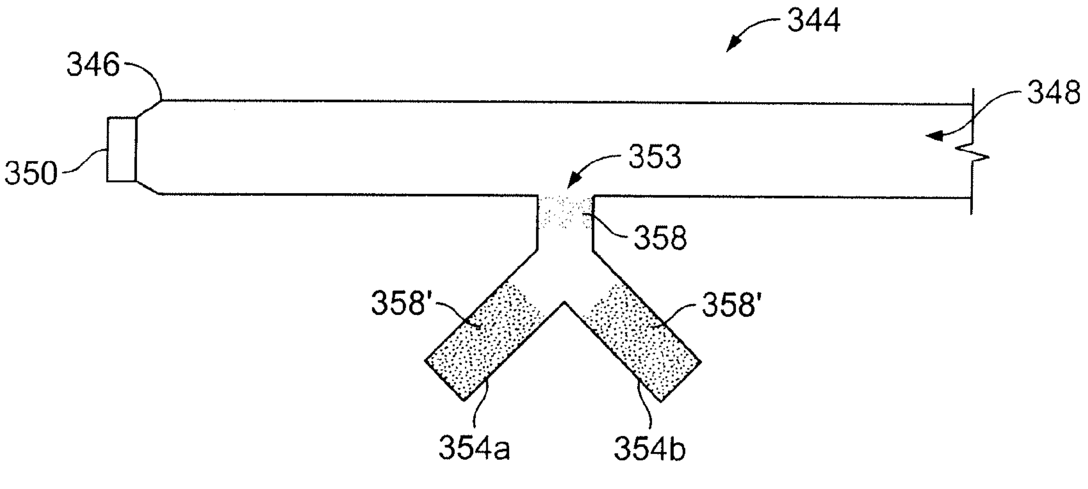

FIGS. 8A, 8B and 8C are schematic representations of waveguides.

Figure 9:
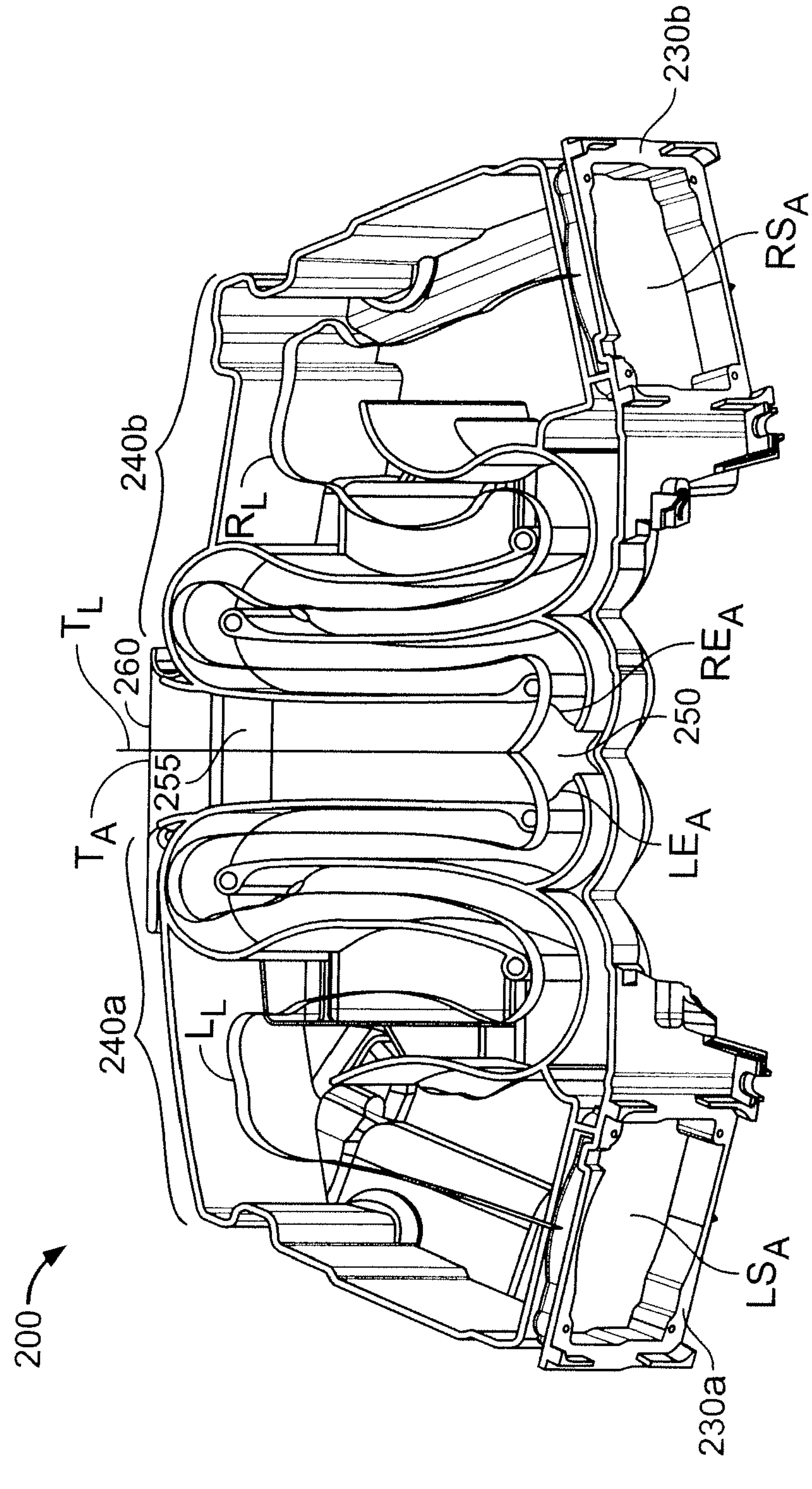

FIG. 9 is a perspective view of a waveguide with the cover section removed.

Figure 10A:
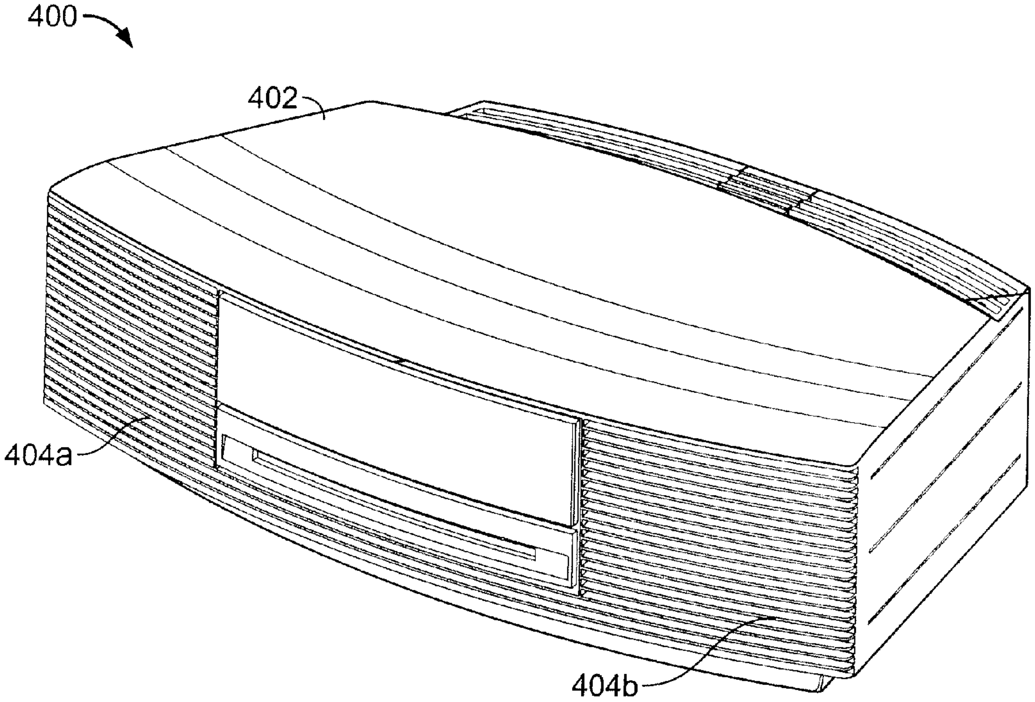
Figure 10B:
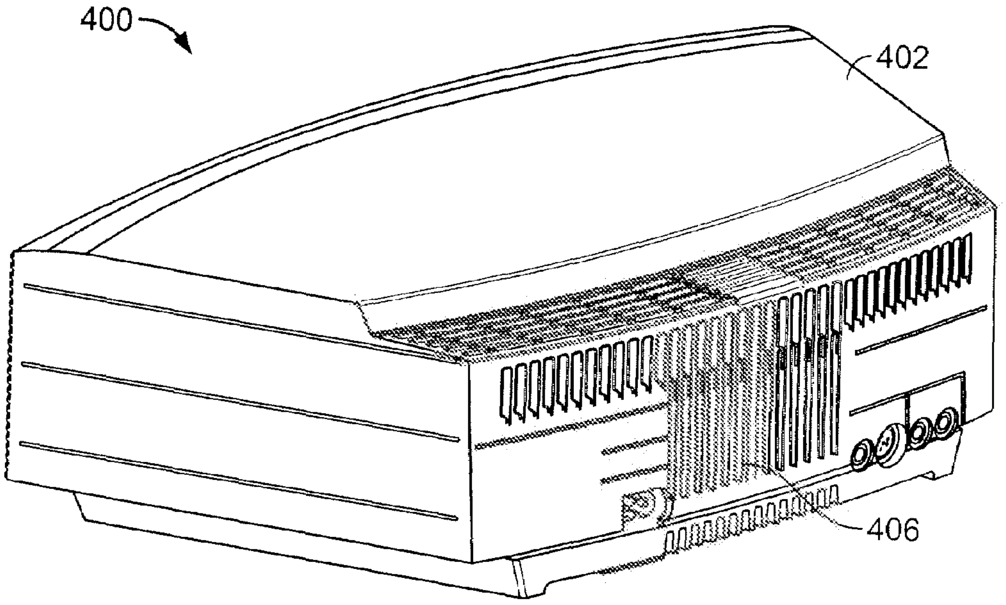

FIGS. 10A and 10B are front and rear three-dimensional views of a radio including an exemplary waveguide.

Figure 1:
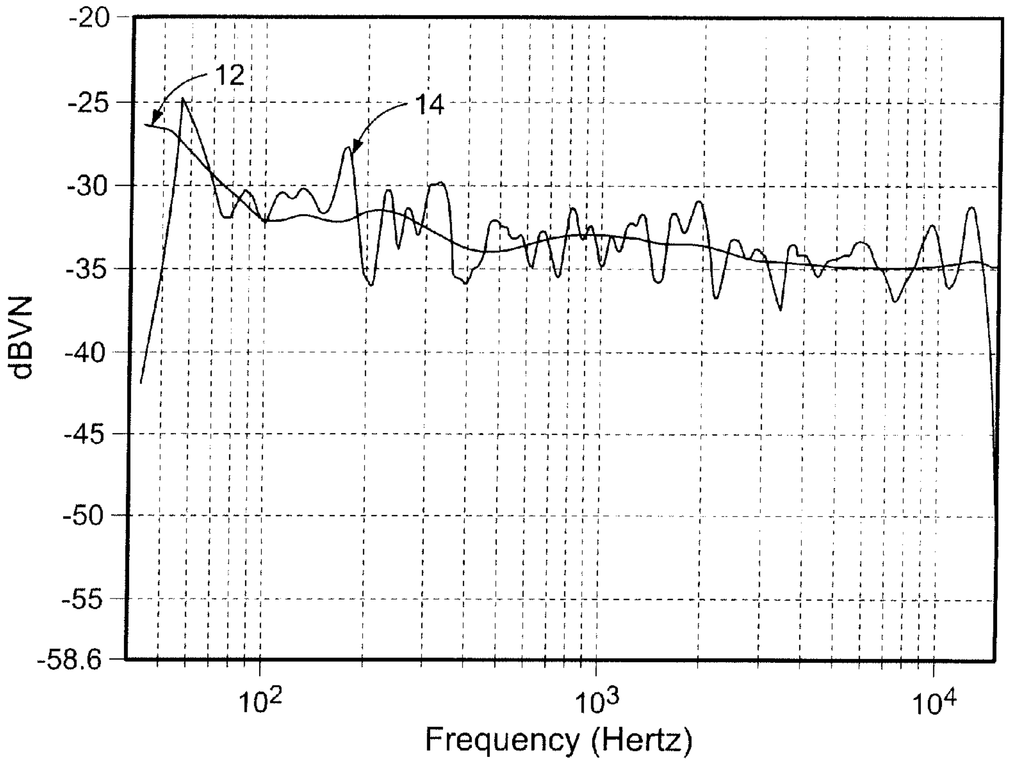
FIG. 1 is a graphical representation of a target and measured room frequency response.

For the embodiments discussed here, a "waveguide" is defined to have certain features. Specifically, waveguide as used herein refers to an acoustic enclosure having a length which is related to the lowest frequency of operation of the waveguide, and which is adapted to be coupled to an acoustic energy source to cause an acoustic wave to propagate along the length of the waveguide. The waveguide also includes one or more waveguide exits or openings with a cross-sectional area, that face free air and allow energy coupled into the waveguide by the acoustic energy source to be radiated to free air through the waveguide exit. Exemplary waveguides can be characterized by specific relationship between the cross-sectional area of the waveguide exit and the wavelength of sound at the low frequency cutoff of the waveguide, where the low frequency cutoff can be defined as the −3 dB frequency. The −3 dB frequency is typically slightly lower in frequency than the lowest frequency standing wave that can be supported by the waveguide, which is typically the frequency where the longest dimension of the waveguide is one quarter of a wavelength. FIG. 1 graphically depicts an exemplary target frequency response 12 and a measured room frequency response 14 of a waveguide according to one example. Embodiments of the invention have the following characteristic:

$$(\sqrt{A})/\lambda \leqq 1/15(0.067)$$

where A is the cross-sectional area of the waveguide exit and λ is the wavelength of the −3 dB frequency of the waveguide system. In one exemplary embodiment, the low frequency cutoff is 55 Hz and corresponding wavelength λ is 20.6 ft. The cross-sectional area of the waveguide exit A is 2.5 sq. in (0.0174 sq ft):

$$(\sqrt{A})/\lambda=(0.0174)^{1/2}/20.6\ \text{ft}=0.2\ \text{ft}/20.6\ \text{ft}=0.0064<1/15\ (0.067)$$

Figure 2:
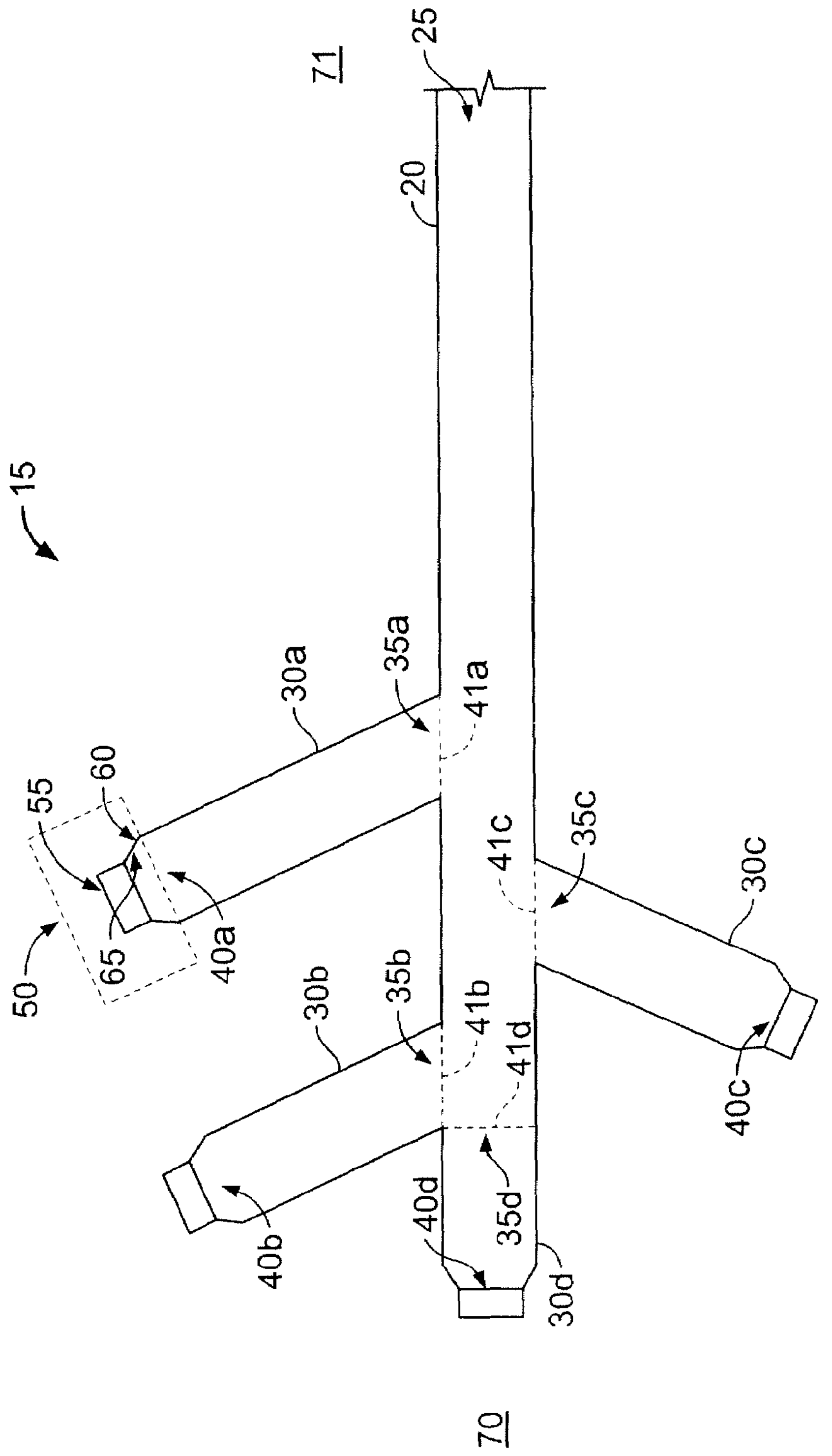
FIG. 2 is a schematic cross-sectional view of a waveguide system.

As seen in FIG. 2, an electroacoustical waveguide system 15 includes a hollow trunk acoustic waveguide section 20, which has a single open end 25, and hollow branch acoustic waveguide sections 30*a*, 30*b*, 30*c* and 30*d*. Each of the branch sections, such as 30*a*, has an open end 35*a* and a terminal end 40*a*. The open ends of the branch sections are coupled to the trunk section 20 at locations 41*a*, 41*b*, 41*c* and 41*d*. The hollow trunk extends from its open end 25 to the locations 41. One or more of the terminal ends 40 of the branch sections (such as 40*a*) are acoustically coupled to an acoustic energy source 50.

Each acoustic energy source can include an acoustic driver 55 that has a radiating surface with an outer side 60 facing free air and an inner side 65 facing the trunk section 20. Although the driver 55 is shown positioned outside the branch waveguide sections, the driver can also be located inside one or more of the branch sections. The acoustic energy sources 50 are connected to an audio source (not shown) through a power amplifier, for example, a radio, a CD or DVD player, or a microphone. The branch sections can be arranged so that the radiating surfaces facing free air are generally aimed toward a designated listening area 70. Sound produced by the acoustic drivers is projected through the air into the listening area 70 and through the waveguide sections into the area 71 at the open end 25 of the trunk section 20. Any number of (or none) branch section drivers could be coupled to face free air. Furthermore, there may be back enclosures coupled to the drivers (not shown). Although areas 70 and 71 are shown apart, these may be essentially the same area or areas not spaced that far apart as shown (e.g., about a foot or two) to keep the waveguide and product in which the waveguide is implemented compact (for example, the waveguide can be folded over on itself to accomplish this).

The physical dimensions and orientations of the branch sections can be modified to suit specific acoustical requirements. For example, the lengths of the respective branch sections can be the same or different. The cross-sectional areas and shapes along each of the branch and trunk sections and between sections can be the same or different. The coupling locations 41*a* through 41*d* for the waveguide sections may be at a common position or at different positions along the trunk, for example, as shown in FIG. 2. The spatial separation of branch sections allows for spatial distribution of different program information that is fed into the listening area 70 from acoustic energy sources 50.

Additional information about acoustic waveguides is set forth in Bose U.S. Pat. Nos. 4,628,528 and 6,278,789 and patent application Ser. No. 10/699,304, filed Oct. 31, 2003, which are incorporated here by reference.

Figure 3:
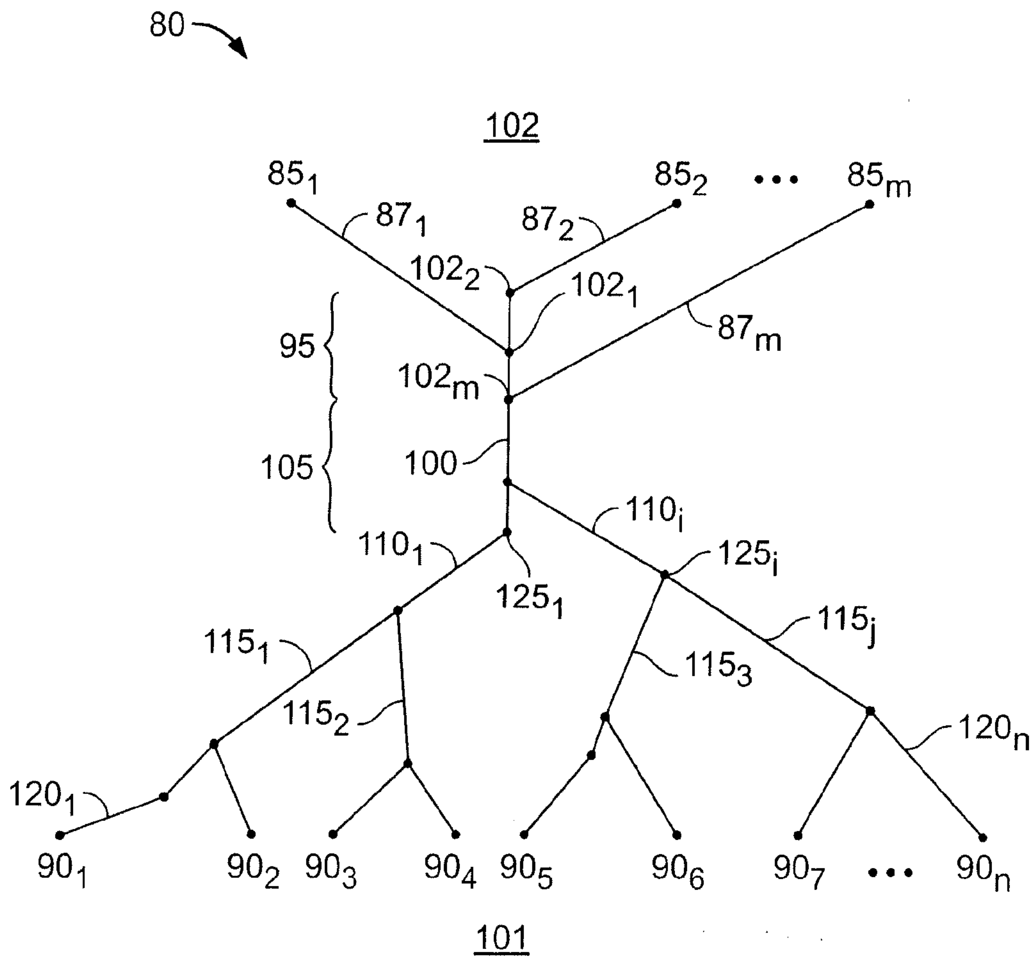
FIG. 3 is a schematic representation of a waveguide system.

As shown in FIG. 3, an electroacoustical waveguide 80 has a general tree structure and includes open end root nodes $\mathbf{85}_1$, $\mathbf{85}_2$, . . . $\mathbf{85}_m$ and terminal end leaf nodes $\mathbf{90}_1$, $\mathbf{90}_2$, . . . $\mathbf{90}_n$. The root nodes are connected along a first portion 95 of a trunk section 100 at root nodes $\mathbf{102}_1$, . . . $\mathbf{102}_m$ by leaf branch sections $87_1$, $87_2$, . . . $87_m$. The end leaf notes $90_1$, $90_2$, . . . $90_n$ are connected to a second portion 105 of the trunk section 100 by a branching network of primary, secondary, and tertiary internal waveguide sections $110_1$, . . . $110_i$, $115_1$, . . . $115_j$, and $120_1$, . . . $120_n$, respectively, and internal nodes, such as $125_1$, . . . $125_i$. Each of the leaf nodes, $90_1$, $90_2$, . . . $90_n$, can be coupled to an acoustic energy source that has an acoustic driver including radiating surfaces, as shown in FIG. 2.

The root nodes are spatially separated from each other. The leaf nodes are spatially separated from each other. Different program information may be fed into the different leaf nodes to produce a spatial distribution of program information. For example, program information having similar or the same low frequency components but with different high frequency components can be fed into the leaf nodes. An outer side of the radiating surfaces of the acoustic drivers of the leaf nodes face a designated listening area 101 and an inner side face into the area 102.

When program information is fed into acoustic sources which drive the leaf nodes 90, the leaf nodes, along with the internal sections 110, 115, 120, and the internal nodes 125, are comparable to the branch sections 30 of FIG. 2. As that program information can merge and be delivered to the root nodes 85, the root nodes, along with the leaf branch section 87 and the trunk section 100 are comparable to the hollow trunk 20 of FIG. 2. Although particular combinations of trunks and branch sections are shown in FIGS. 2 and 3, a wide variety of other combinations and configurations of trunk and branch sections are contemplated in an exemplary waveguide.

Figure 4:
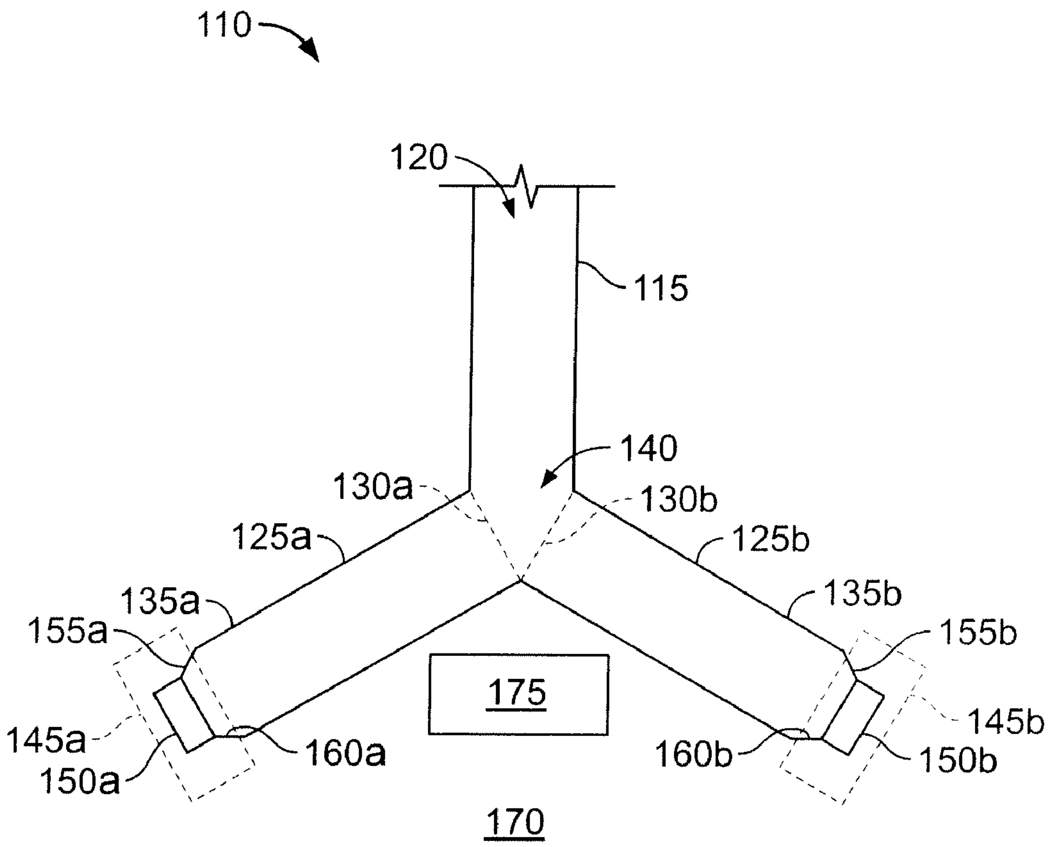
FIG. 4 is a schematic cross-sectional view of a waveguide system.

In the example shown in FIG. 4, an electroacoustical waveguide system 110 includes a trunk section 115 that has a single open end 120 and two branch sections 125*a*, 125*b* extending from the other end of the trunk section. The two branch sections have open ends 130*a* and 130*b* and terminal ends 135*a* and 135*b*. The open ends of the two branch sections are coupled to the trunk section 20 at a substantially common location 140. The two branch sections are acoustically coupled to acoustic energy sources 145*a* and 145*b* located at the terminal ends 135*a* and 135*b*. The acoustic energy sources can each include acoustic drivers 150*a* and 150*b*. Each of the acoustic drivers also has a radiating surface on a back side 155*a*, 155*b* of the acoustic driver, facing free air, and a front side 160*a*, 160*b* of the acoustic driver that is generally oriented toward the trunk section 115. It should be noted that the driver motor 150*a*, 150*b* can be located inside the branch sections 125*a*, 125*b*, rather than the outside orientation as shown, and the front side 160*a*, 160*b* will face free air.

Separate program information can be fed into each branch section, which may be highly correlated or uncorrelated, or may be highly correlated just over a given frequency ranges, such at low frequency range, for example.

A wide variety of implementations of the arrangement in FIG. 4 are possible. In one example, shown in FIG. 5, which is suitable for use in a table radio/CD player, a waveguide 200 has a right portion 205, a middle portion 210, and a left portion 215. The waveguide is a rigid structure formed by an injection molding process using a synthetic resin, such as LUSTRAN™ 448 (Bayer Corporation, Elkhart, Ind.), for example. As shown also in FIGS. 6A, 6B, and 6C, The waveguide includes a main body 220, depicted in FIGS. 6A through 6E and a cover section 225, depicted in FIGS. 7A through 7C, which are molded separately and then bonded together.

Referring collectively to FIGS. 6A through 6E and 7A and 7C, the waveguide includes left and right frames 230*a*, 230*b* located in the left and right portions of the waveguide and contain left and right acoustic drivers 235*a*, 235*b* (shown schematically). The drivers each include a radiating surface (not shown) with a first side facing the free air and a second side, opposite the first, facing into the waveguide.

FIGS. 6A through 6E show detailed views of a waveguide trunk section 255 and left and right branch sections 240*a* and 240*b*. Each branch section is a folded continuous tube defining an interior passage and extending from one of the left and right frames containing the drivers at either end of the waveguide to a branch junction 250. The trunk section 255 extends from the branch junction to a single trunk opening 260 having a flared end. Each of the folds defines subsections within each branch section. Each subsection is bounded by baffles or panels extending from the front to the rear of the waveguide. The waveguide housing can also support components such as a CD player, AM antenna, and power supply, for example. The acoustic waveguide system as shown may further include an electronic device (not shown) which uses acoustic energy sources to provide program information to the branch sections.

The first left and right subsections 265*a*, 265*b*, respectively, are partially formed by the outside surfaces (facing the drivers) of tapered first panels 270*a*, 270*b* adjacent the drivers 235*a*, 235*b* and extend to the second subsections 275*a*, 275*b*. The second subsections are formed by the inside surfaces (facing the trunk section 255) of the tapered first panels 270*a*, 270*b* and an outside surface of second panels 280*a*, 280*b* and extend to the third subsections 290*a*, 290*b*. Generally, each of the panels is a curved vertical surface extending from the front or back of the waveguide and includes a free edge. A contoured post 285 is formed at each free edge to reduce losses and turbulence of the acoustic pressure waves. The third subsections 290*a*, 290*b* are formed by the inside surfaces of the second panels and the outside surface of third panels 295*a*, 295*b* and extend to the fourth subsections 300*a*, 300*b*. The fourth subsections are formed by the inside surfaces of the third panels and the outside surface of the trunk section walls 305*a*, 305*b* and extend from the third subsections to connect with the trunk section 255 at the branch junction 250.

The cross-sectional area of each of the branch sections continuously decreases along a path from the left and right frames to the branch junction 250. The first and second subsections are relatively large and more tapered compared with the third and fourth subsections and the common trunk section. Progressing from the second subsection to the third and fourth subsection, the cross-sectional area and degree of taper of the adjacent panels decrease as the height of the subsections along the middle portion 210 decreases. The total volume and cross-sectional area profiles of the left and right branch sections are similar. However, the left and right sections are not completely symmetrical because of the need to accommodate the packaging of differently-sized electronic components within the waveguide 200. For example, an AM antenna (not shown) is located in the left portion and a power supply/transformer (not shown) is located in the right portion.

Figure 6A:
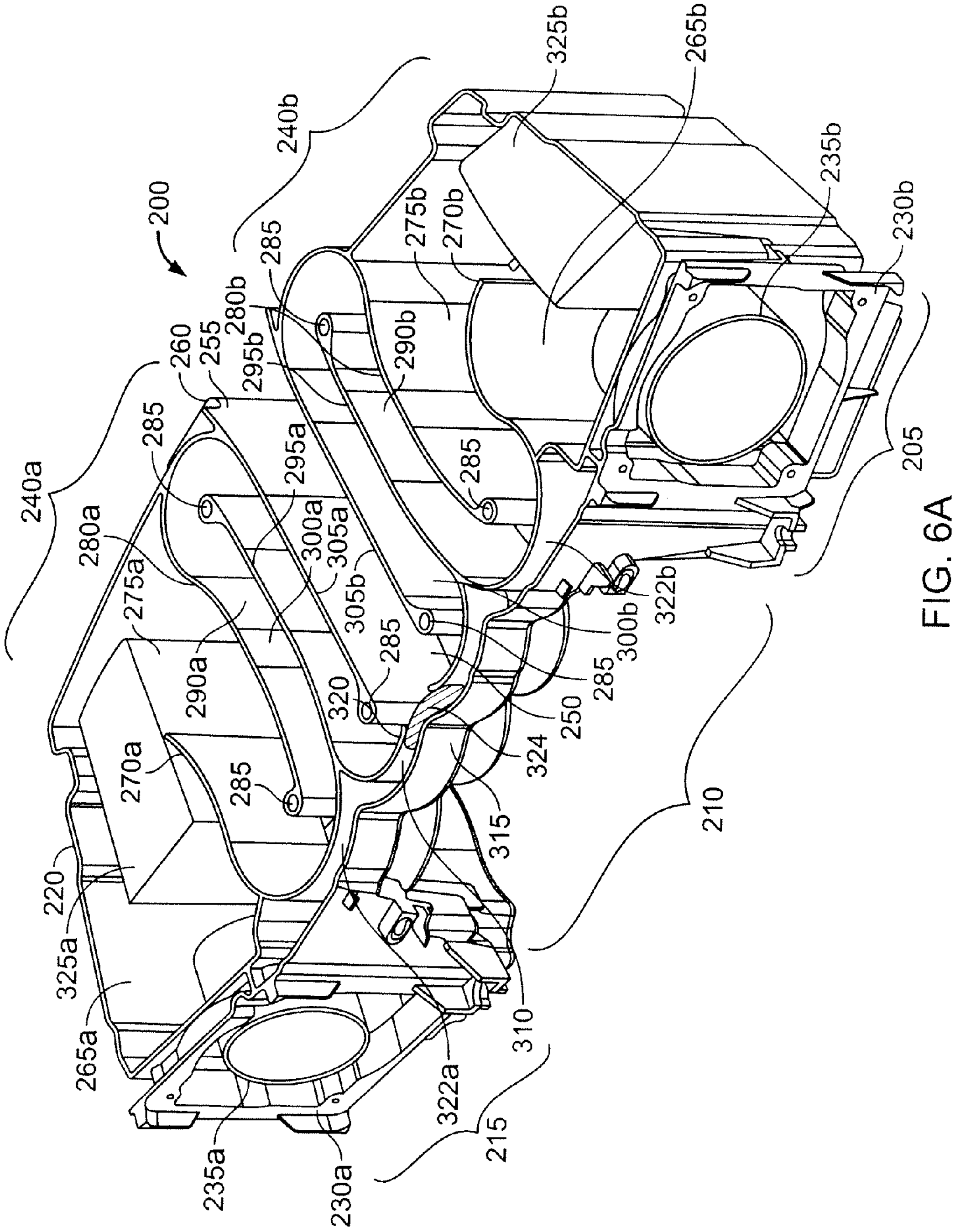
FIGS. 6A through 6E are three-dimensional, top, front, bottom, and broken away end views, respectively, of a waveguide with a cover section removed.
Figure 6B:
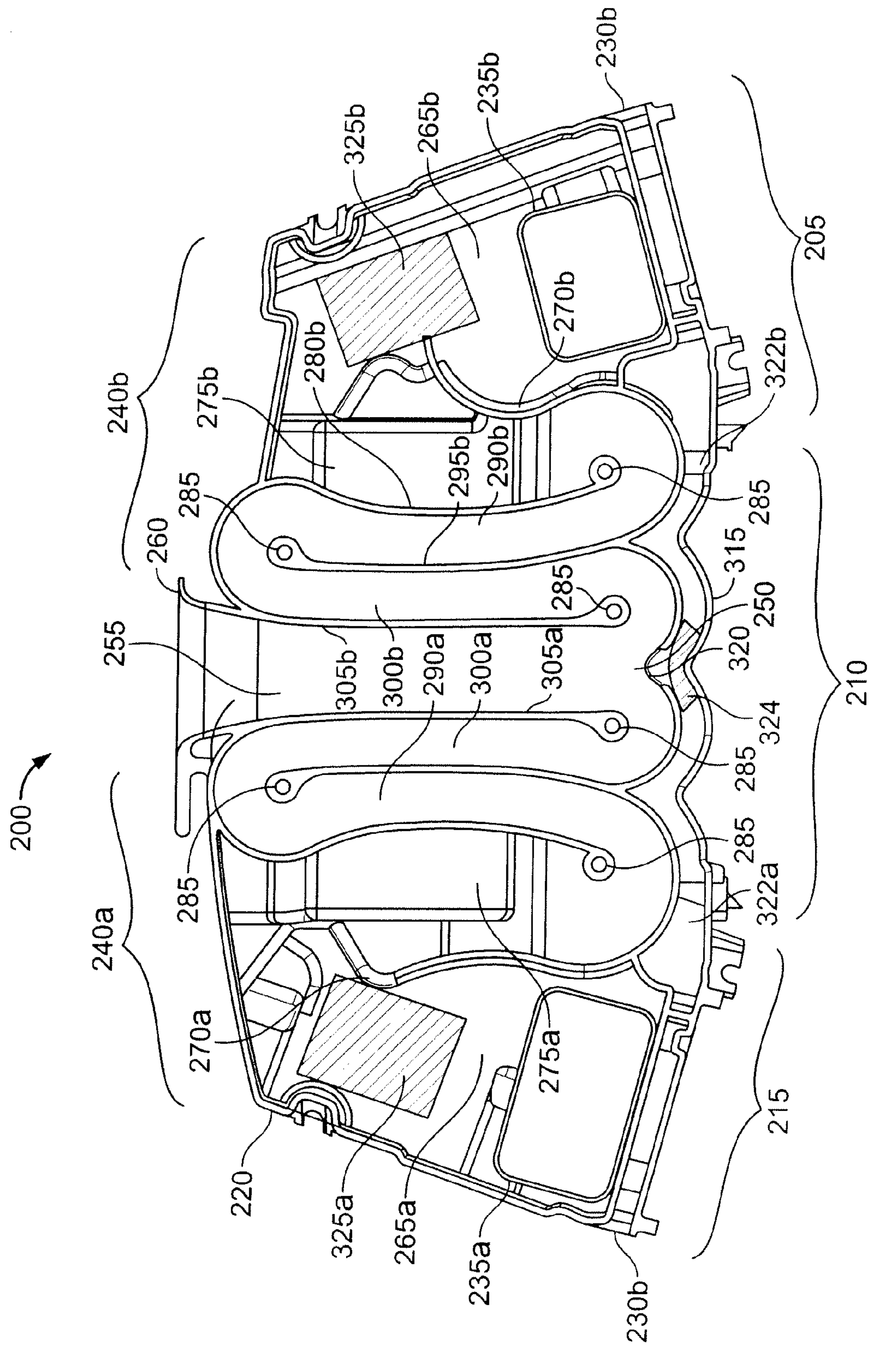
Figure 6C:
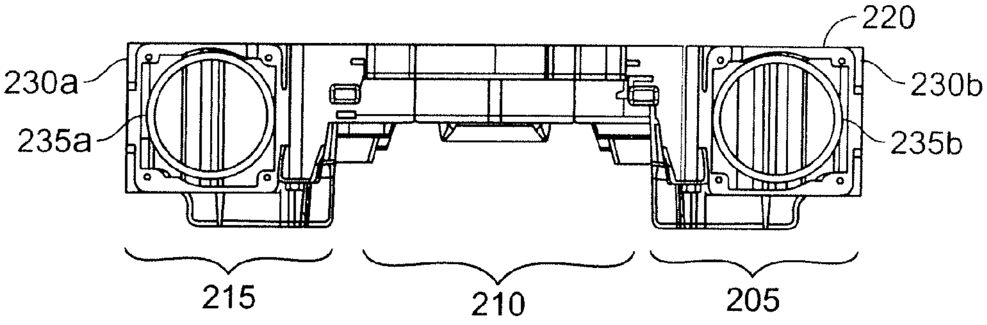
Figure 6D:
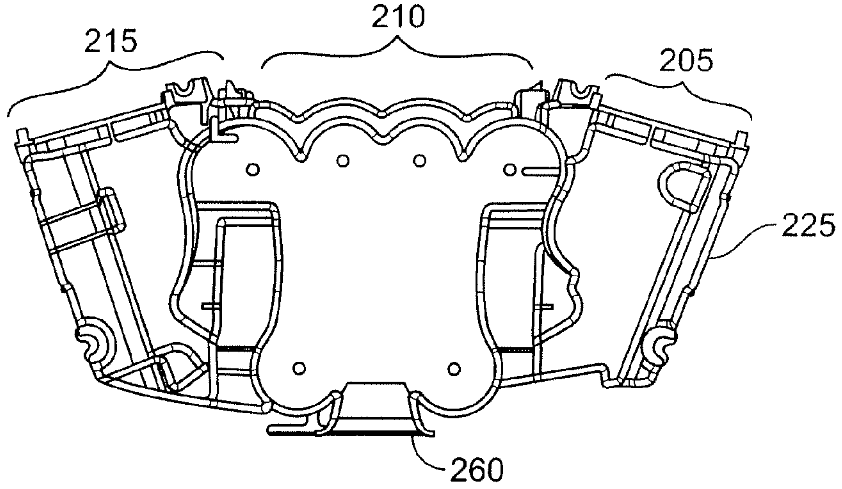
Figure 6E:
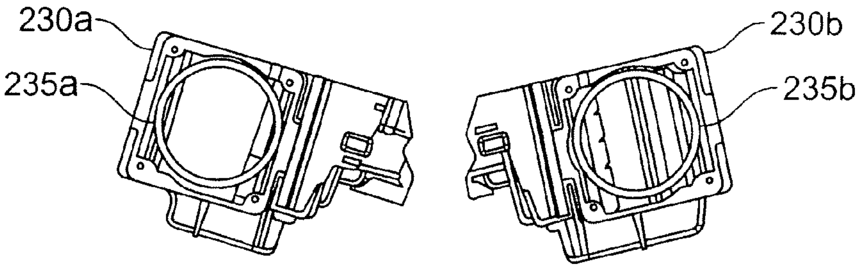

With specific reference to FIGS. 6A and 6B, the front of the waveguide includes a lateral channel 310 extending from an upper portion of the left driver frame 230*a* to an upper portion of the right driver frame 230*b*. The lateral channel is formed between a front portion of the second, third and fourth panels and a middle panel 315. Vent 320 proximate the branch junction 250 connects the center of the lateral channel 310 to the trunk section 255. The lateral channel 310 includes a left branch channel 322*a*, extending from the vent 320 to an upper portion of the left driver frame, and a right branch channel 322*b*, extending from the vent 320 to an upper portion of the right driver frame. The left and right branch channels 322*a*, 322*b* form acoustic structures, such as the elongate cavities depicted, that are sized and configured for reducing the magnitude of a resonance peak. The length of the elongate cavities are chosen to exhibit a resonance behavior in the frequency range where it is desired to control the magnitude of a resonance peak in the waveguide. The elongate cavity is designed such that the acoustic pressure due to the resonance in the elongate member, that is present at the location where the elongate member couples to the waveguide, destructively interferes with the acoustic pressure present within the waveguide, thus reducing the peak magnitude.

In one example, the center of the lateral channel 310 proximate the vent 320 contains resistive acoustical dampening material 324 such as polyester foam or fabric, for example, to help reduce this peak. The resonance peak in one example is 380 Hz. In one example, the length of the elongate member is chosen such that it is one quarter of the wavelength of the frequency of the resonance peak that it is desired to reduce. The cross-section area of the vent 320 can be as small as 25 percent of the cross-section area of the trunk.

Additionally, as shown, resistive acoustical dampening materials 325*a*, 325*b* can be placed behind each driver within first left and right subsections 265*a*, 265*b*, respectively, to damp out peaks at the higher frequencies (710 Hz-1.2 kHz in one example), but not affect the low frequencies as disclosed in the subject matter of U.S. Pat. No. 6,278,789. It should be noted that the location of the vent 250 and the cavities 322*a*, 322*b* are not limited to what has shown in FIGS. 6A and 6B. The location of the cavities can be anywhere along a general waveguide system corresponding to the pressure maximum of the target standing wave and the particular resonance peak to be attenuated. The use of such cavities for damping out a resonance peak is not limited to waveguides having common trunk and branch section configurations.

Referring now to FIG. 8A, a waveguide system includes a waveguide 330 having a trunk section 332 with a single open end 334 and two branch section 336*a*, 336*b* extending from the opposite end of the trunk section. Two cavities 338*a*, 338*b* are attached to the waveguide between the two branch sections at a vent 340. By establishing a vent 340 in the trunk, a target frequency component, 380 Hz in one example is significantly reduced. Resistive acoustical dampening materials 342 can be located proximate the vent 340 and/or in one or both of the cavities 338*a*, 338*b*. The cavities may also be located in the branch sections or bifurcated into multiple cavities for reducing multiple resonance peaks.

Referring now to FIGS. 8B and 8C, a waveguide system includes an acoustical waveguide 344 having a terminal end 346 and an open end 348. An electroacoustical driver 350 is coupled to the terminal end 346. The waveguide 344 is connected with a cavity 352 by a vent 353, or as shown in FIG. 8C, a bifurcated cavity having first and second subsections, 354*a*, 354*b*, commonly attached at vent 353 to the waveguide 344. In another example, the waveguide 344 leaks directly into the space outside the waveguide 344 (not shown). The vent 353 can have a cross-sectional area equal to or less than the cross-section area of the cavities. The cavities 352, 354*a*, 354*b* define a small volume as compared with the volume of the waveguide 344 and can include, for example, a resonance tube. Various other examples are disclosed in the subject matter of Bose patent application Ser. No. 10/699,304, filed Oct. 31, 2003. Acoustical dampening materials 356 (FIG. 8B) can be positioned proximate vent 353 and may fill a portion or substantially all of cavity 352 as indicated by dampening material 356'. Dampening material 358 (FIG. 8C) may fill a portion or substantially all of one or both cavities 354*a*, 354*b*, as indicated by dampening material 358'.

Referring to FIG. 9 and in one example, the waveguide 200 has dimensions as follows. The length $T_L$ of the trunk section 255 extending from the branch junction 250 to the trunk opening 260 is 4.8 in (122.4 mm) and the cross-sectional area $T_A$ of the trunk opening 260 is 2.5 sq. in. (1622 sq. mm). The length $L_L$ of the left subsection 240*a* of the waveguide from the start of the left subsection at the left frame 230*a* to the end of the left subsection proximate the branch junction 250 is 21.4 in (543.7 mm). The length $R_L$ of the right subsection 240*b* from the start of the right subsection at the right frame 230*b* to the end of the right subsection proximate the branch junction 250 is 21.0 in (535 mm). The cross-sectional area $LS_A$ at start of the left subsection is 7.9 sq. in (5134 sq. mm) and the cross-sectional area $RS_A$ at the start of the right subsection is 8.3 sq. in. (5396 sq. mm). The cross-sectional areas $LE_A$, $RE_A$ at the ends of the left subsection and right subsections, respectively, are 0.7 sq. in (448 sq. mm). Other dimensions wherein the waveguide lengths are related to the lowest frequency of operation and the cross-sectional areas are related to the −3 dB low frequency of the waveguide system, as described above, are contemplated.

As seen in FIGS. 10A and 10B, a radio 400 includes a housing 402 to enclose the waveguide system 200 (FIG. 5). In this example, the housing is substantially trapezoidal, approximating the overall shape of the waveguide. The radio 400 includes left and right openings 404*a*, 404*b*, corresponding to drivers 235*a* and 235*b* and a rear opening 406 generally proximate to the trunk opening 260. Components 410 including a CD player and display, for example, are mounted generally along the middle portion 210 of the waveguide (FIG. 6A).

In operation, an audio circuit (e.g., an audio amplifier, or an audio amplifier combined with an audio source such as a radio or a CD player) drives two speakers (or other acoustic energy sources) that are mounted at the terminal ends of the two branch waveguide sections. The two speakers are driven by distinct audio program parts, for example, left and right channels of an audio source. The waveguides enhance the sound produced by the drivers and the smooth interior passages of the branch and trunk sections reduce turbulence and minimize acoustic reflections. Because the branch waveguide sections are spatially separated, the enhanced program parts are delivered separately to the listener. At the common trunk, the distinct program parts carried in the two branch sections can merge, and space can be saved because only a single trunk is required, without affecting the audio separation of the two program parts experienced by the user. Thus, the structure achieves the benefits of spatially separated waveguides with the space savings of a single trunk at the end away from the acoustic energy sources.

Other implementations are within the scope of the following claims.

What is claimed is:

1. An apparatus comprising a trunk acoustic waveguide section having a free end, and branch acoustic waveguide sections each having a junction end coupled to the trunk and a terminal end to receive an acoustic energy source, lengths of the branch acoustic waveguide sections being substantially the same, at least one of the waveguide sections having a cross-sectional area that varies along at least a portion of a length of the at least one of the waveguide sections, including at least one location other than ends of the at least one of the waveguide sections.

2. The apparatus of claim 1 in which the cross-sectional area of at least one of the branch waveguide sections decreases from the terminal end to the junction end.

3. The apparatus of claim 1 in which internal volumes of the branch waveguide sections are substantially the same.

4. The apparatus of claim 1 also including the acoustic energy sources.

5. The apparatus of claim 4 in which each acoustic energy source includes an acoustic driver.

6. The apparatus of claim 5 wherein each acoustic driver includes a first radiating surface acoustically coupled to the terminal end of the branch waveguide section and a second radiating surface facing free air.

7. The apparatus of claim 6 wherein the second radiating surfaces are substantially oriented toward a first direction.

8. The apparatus of claim 1 also including a main housing and in which the branch waveguide sections further comprise subsections, the subsections partially formed by panels extending from inside surfaces of the main housing.

9. The apparatus of claim 8 in which the lengths of the subsections of respective branch waveguide sections are substantially the same.

10. The apparatus of claim 1 in which the cross-sectional area of the trunk waveguide section increases along the length from the free end.

11. The apparatus of claim 1 in which at least two of the branch waveguide sections are coupled at different locations along the trunk section.

12. The apparatus of claim 1 in which the terminal ends of the branch waveguide sections are spatially separated.

13. The apparatus of claim 8 wherein the main housing is substantially trapezoidal.

14. The apparatus of claim 1 in which the branch waveguide sections have unequal lengths.

15. The apparatus of claim 1, wherein a relationship between a cross-sectional area A of the free end and a wavelength of sound at a low frequency cutoff λ of the waveguide is given by:

$$\sqrt{A}/\lambda \leqq 0.067.$$

16. The apparatus of claim 1, also comprising a damping material to substantially reduce a resonance peak.

17. The apparatus of claim 1, also comprising a lateral channel coupled to the waveguide to substantially reduce a resonance peak.

18. The apparatus of claim 1, also comprising a lateral channel coupled to the waveguide and a damping material disposed where the waveguide and the lateral channel are coupled.

19. The apparatus of claim 1, wherein each of the acoustic energy sources of the branch waveguide sections radiates different program information.

20. The apparatus of claim 7, wherein the free end faces a second direction substantially opposite to the first direction.

21. An acoustic waveguide system comprising a trunk waveguide section having a single free end, and a cross-sectional area that progressively increases along a length of the trunk waveguide section from the free end;

first and second branch waveguide sections coupled to the trunk waveguide section at locations other than the free end; and each of the first and second waveguide sections having a terminal end acoustically coupled to an acoustic energy source including at least one acoustic driver, at least one of the waveguide sections having a cross-sectional area that varies along at least a portion of a length of the at least one of the waveguide sections, length including at least one location other than ends of the at least one of the waveguide sections.

22. The acoustic waveguide system in claim 21 in which the first and second branch waveguide sections have substantially the same length.

23. The acoustic waveguide system in claim 21 in which the first and second branch waveguide sections have substantially the same cross-sectional area along their lengths.

24. The acoustic waveguide system in claim 21 in which the terminal ends of the first and second branch waveguide sections are spatially separated from each other.

25. The acoustic waveguide system in claim 21 in which each acoustic driver comprises a first radiating surface facing free air and a second radiating surface, opposite the first surface, acoustically coupled to the branch waveguide section.

26. The acoustic waveguide system in claim 25 in which each first radiating surface substantially faces a first direction.

27. The acoustic waveguide system in claim 26 further includes an electronic device which uses acoustic energy sources to provide program information to the first and second waveguide sections.

28. The acoustic waveguide system of claim 21, wherein the acoustic energy source coupled to the first waveguide section and the acoustic energy source coupled to the second waveguide section radiate different program information.

29. The acoustic waveguide system of claim 28, wherein the different program information includes a left and a right channel of an audio source.

30. The acoustic waveguide system of claim 29, wherein the audio source is located substantially between the terminal ends of the first and second waveguide sections.

31. The acoustic waveguide system of claim 21, wherein a relationship between a cross-sectional area A of the free end and a wavelength of sound at a low frequency cutoff λ of the waveguide is given by:

$$\sqrt{A}/\lambda \leqq 0.067.$$

32. The acoustic waveguide system of claim 21, further comprising a damping material for substantially reducing a resonance peak.

33. The apparatus of claim 21, also comprising a lateral channel coupled to the waveguide to substantially reduce a resonance peak.

34. The apparatus of claim 21, also comprising a lateral channel coupled to the waveguide and a damping material disposed where the waveguide and the lateral channel are coupled.

35. The acoustic waveguide system of claim 26, wherein the single free end faces a second direction substantially opposite to the first direction.

36. An audio player comprising a housing, an electronic audio circuit, an acoustic energy source coupled to the electronic audio circuit, and a waveguide structure comprising a trunk acoustic waveguide section having a free end, and a plurality of branch acoustic waveguide sections each having a junction end coupled to the trunk and a terminal end to receive an acoustic energy source, lengths of the branch acoustic waveguide sections being substantially the same, at least one of the waveguide sections having a cross-sectional area that varies along at least a portion of a length of the at least one of the waveguide sections, length including at least one location other than ends of the at least one of the waveguide sections.

37. An electroacoustical waveguide transducing system comprising a trunk acoustic waveguide section having a free end, first and second branch acoustic waveguide sections each having a junction end coupled to the trunk and a terminal end to receive an acoustic energy source, and an elongate cavity defining a volume substantially smaller than the volume of the trunk and branch sections, the cavity linked to at least one of the branch sections and trunk section by an aperture, the aperture being located proximate a junction of at least two of the branch sections and truck section, and first and second acoustic energy sources coupled to the terminal ends of the first and second branch waveguide sections and comprising first and second acoustic drivers each comprising a first radiating surface acoustically coupled to the terminal ends of the first and second sections and a second radiating surface facing the free air, at least one of the waveguide sections having a cross-sectional area that varies along at least a portion of a length of the at least one of the waveguide sections, length including at least one location other than ends of the at least one of the waveguide sections.

38. The system of claim 37 in which the relationship between the cross-sectional area of the free end, A and the wavelength of sound at a low frequency cutoff of the waveguide, λ is given by:

$$(\sqrt{A})/\lambda \leqq 0.067.$$

39. The system of claim 38 in which the low frequency cutoff is about 55 Hz.

40. The system of claim 38 in which the cross-sectional area, A is about 2.5 sq in.

41. An apparatus comprising an acoustic waveguide system having a tree-structure and comprising:

a first number of open end root nodes, a second number of terminal end leaf nodes, and the first number of open end root nodes being connected to the second number of terminal end leaf nodes via a plurality of internal waveguide sections and a third number of internal nodes, wherein lengths of the plurality of internal waveguide sections are substantially the same, and wherein each one of the second number of terminal leaf nodes is acoustically coupled to an acoustic energy source, at least one of the waveguide sections having a cross-sectional area that varies along at least a portion of a length of the at least one of the waveguide sections, length including at least one location other than at ends of the at least one of the waveguide sections.

42. The apparatus of claim 41 wherein the second number is larger than the first number.

43. The apparatus of claim 41 in which the first number of open end root nodes are spatially separated from each other.

44. The apparatus of claim 41 in which each of the second number of terminal end leaf nodes are coupled to an acoustic energy source.

45. The apparatus of claim 44 wherein the acoustic energy source comprises at least one acoustic driver.

46. The apparatus of claim 41 in which the second number of terminal end leaf nodes are spatially separated from each other.

47. The apparatus of claim 41 in which different program information is fed into the second number of terminal end leaf nodes.

48. An apparatus comprising a trunk acoustic waveguide section having a free end, first and second branch acoustic waveguide sections each having a junction end coupled to the trunk and a terminal end to receive an acoustic energy source, and an elongate cavity defining a volume substantially smaller than the volume of the trunk and branch sections, the cavity attaching to at least one of the branch sections and trunk section via a vent which forms an aperture between the sections and the cavity, wherein the elongate cavity is sized and the vent is positioned along at least one of the branch and trunk sections to substantially reduce a resonance peak, at least one of the waveguide sections having a cross-sectional area that varies along at least a portion of a length of the at least one of the waveguide sections, length including at least one location other than ends of the at least one of the waveguide sections.

49. The apparatus of claim 48 in which the elongate cavity comprises a bifurcated resonance chamber.

50. The apparatus of claim 48 further comprising acoustic dampening material positioned within the elongate cavity.

51. An electroacoustical waveguide transducing system comprising a waveguide having a free end and a terminal end, first and second branch acoustic waveguide sections each having a junction end coupled to the terminal end of the waveguide and a terminal end to receive an acoustic energy source, first and second acoustic drivers each comprising a first radiating surface acoustically coupled to the terminal ends of the first and second sections and a second radiating surface facing the free air, and an elongate cavity having a length of about one quarter of the wavelength of a target standing wave within the waveguide and defining a volume substantially smaller than the volume of the waveguide, the cavity attaching to the waveguide via a vent, the vent located at a point along the length of the waveguide corresponding or close to the pressure maximum of the target standing wave, the waveguide having a cross-sectional area that varies along at least a portion of its length including at least one location other than near an end of the waveguide, and a relationship between a cross-sectional area of the free end, A and a wavelength of sound at a low frequency cutoff of the waveguide, λ is given by:

$$(\sqrt{A})/\lambda \leqq 0.067.$$

52. The system of claim 51 further comprising acoustic dampening material positioned proximate the vent.

53. The system of claim 51 further comprising acoustic dampening material positioned within the elongate cavity.

* * * * *